United States Patent [19]
Suh

[11] Patent Number: 6,006,290
[45] Date of Patent: Dec. 21, 1999

[54] SYSTEM FOR PERFORMING HIGH SPEED BURST OPERATION IN MEMORY DEVICE UTILIZING CAS CLOCK TO CONTROL AND ACTIVATE /WE AND /OE CONTROL SIGNALS

[75] Inventor: Jung Won Suh, Ichon-shi, Rep. of Korea

[73] Assignee: Hyundai Electronics Industries Co. Ltd., Kyoungki-do, Rep. of Korea

[21] Appl. No.: 08/968,500

[22] Filed: Nov. 12, 1997

[30] Foreign Application Priority Data

Nov. 15, 1996 [KR] Rep. of Korea ................ 96-54194

[51] Int. Cl.$^6$ ................ G06F 1/04; G06F 1/12
[52] U.S. Cl. ................ 710/35; 711/105; 711/111; 711/167; 713/401; 713/501; 713/600
[58] Field of Search ................ 711/105, 111, 711/167; 713/501, 600, 401; 710/33, 35

[56] References Cited

U.S. PATENT DOCUMENTS

| | | | |
|---|---|---|---|
| 5,386,391 | 1/1995 | Watanabe | 365/233 |
| 5,577,193 | 11/1996 | Butler et al. | 395/515 |
| 5,703,829 | 12/1997 | Suzuki et al. | 365/233 |
| 5,737,276 | 4/1998 | Shin et al. | 365/230.08 |
| 5,751,656 | 5/1998 | Schaefer | 365/233.5 |
| 5,805,873 | 9/1998 | Roy | 395/557 |
| 5,813,023 | 9/1998 | McLaury | 711/105 |
| 5,857,095 | 1/1999 | Jeddeloh et al. | 395/552 |

*Primary Examiner*—Thomas C. Lee
*Assistant Examiner*—Rehana Perveen
*Attorney, Agent, or Firm*—Gary M. Nath; Gregory B. Kang; Nath & Associates

[57] ABSTRACT

Disclosed a conrol method and an apparatus for performing high speed burst operation in memory device which can perform high speed burst read/write operations at a speed superior to be superior to an operation speed of a burst EDO mode type DRAM by shortening a CAS access time tCAC, and can produce an identical package using signals which are used in a memory device of a EDO mode type DRAM. The method comprising the steps of preparing an "Idle" status where an internal circuit is precharged after a "Power On" status, determining a read mode, a write mode, a read/write mode, or a write/read mode in accordance with a /WE signal at a falling edge of a /CAS signal in which a column address is inputted in a case of a "Row Open" status by an instruction which is inputted during the "Idle" status, and automatically returning to the "Row Open" status if an operation of the read, write, read/write, or write/read mode is ended. Accordingly, the present invention can be used for a 66 MHz bus clock frequency which can not be applied to the conventional burst EDO mode type DRAM, and for the next generation 75–100 MHz bus clocks frequency. Further, there is an advantage that the present invention does not use the external clock, unlike a synchronous type DRAM, thereby reducing the power consumption of the total memory system.

3 Claims, 17 Drawing Sheets

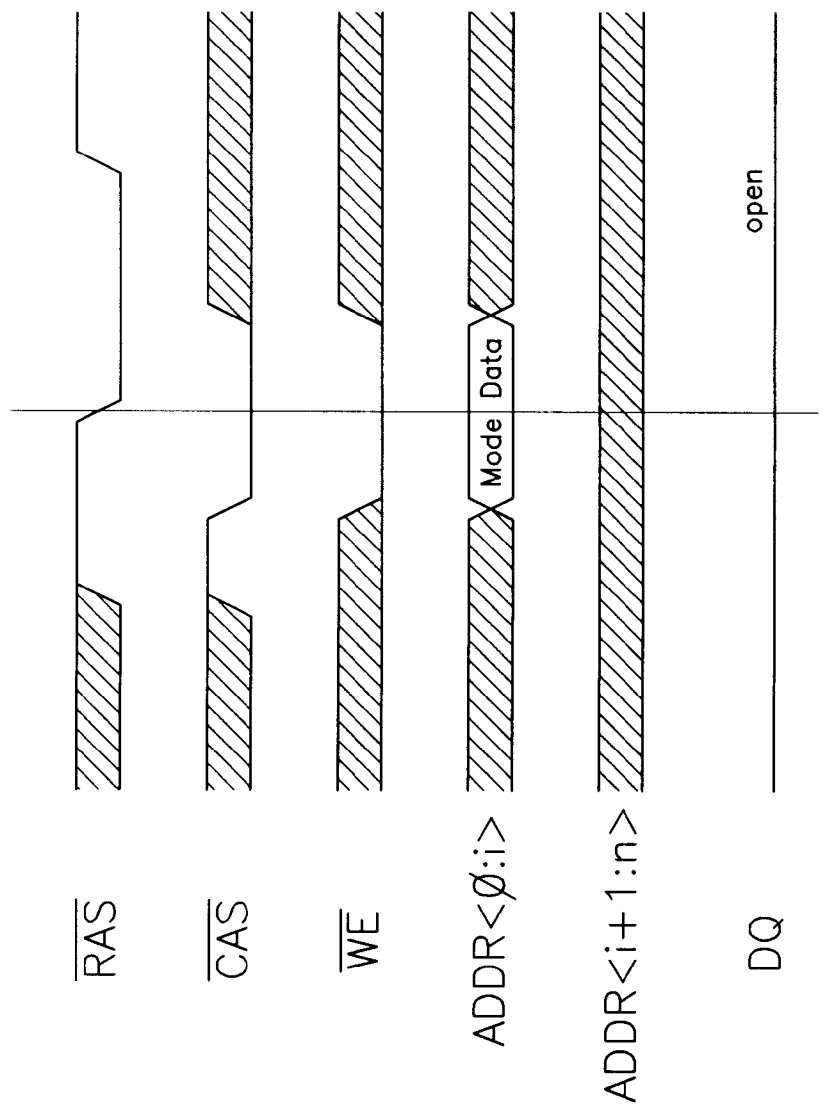

SYSTEM FOR PERFORMING HIGH SPEED BURST OPERATION IN MEMORY DEVICE UTILIZING CAS CLOCK TO CONTROL AND ACTIVATE /WE AND /OE CONTROL SIGNALS

BACKGROUND OF THE INVENTION

1. Field of the Invention

This invention relates to a control method for performing high speed burst operation and an apparatus thereof in memory device which can perform high speed burst Read/Write operations in response to a next generation bus clock frequency.

2. Description of the Prior Art

As dynamic random access memories(DRAMs) used in a major memory device of a computer have been developed in various types, a high speed DRAM of clock synchronous type has been usually mounted on a system requiring higher performance such as a workstation. The reason for mounting the DRAM on the system is not only to increase memory bus clock frequency, but also to increase data transmission speed.

A major standard DRAM which is widely provided in the world market is a product having a fast page mode, thus a fast page mode DRAM has been used in almost all systems from high cost products having good performance to low cost products.

However, an extended data out (EDO) mode type DRAM which is an improvement from the fast page mode DRAM of a non-synchronous type has been also used in the world market in response to continuously developing systems which require a faster operation cycle. Namely, a major advantage of the EDO mode type DRAM is to provide a faster operation cycle at the same manufacturing cost as that of the fast page mode DRAM. In a case where RAS access time tRAC is maximum 50 nsec, an operation cycle time of the high speed page mode type DRAM is minimum 35 nsec, while that of the EDO mode type is less 20 nsec.

Accordingly, a major memory device of the EDO mode type DRAM can operate a memory bus having 30–40 MHz clock signal. But, if the bus clock frequency is over 40 MHz, it is difficult to use the EDO mode type DRAM.

In order to solve this problem, a burst EDO mode DRAM which can increase the clock frequency with respect to that of the EDO mode type has been disclosed by the Micron Company. In such DRAM, in case that the RAS access time of the DRAM is 50 nsec, the operation cycle time of the burst EDO mode is 15 nsec, shorter than that of the EDO mode type. The using method of both the burst EDO mode type and the EDO mode type DRAMs are almost same, but the burst EDO mode type DRAM can be operated in response to a bus clock frequency of 40–50 MHz, which is higher than that of the EDO mode type.

On the other hand, since a bus clock signal of P6, which is a next generation microprocessor of the Intel Inc. in U.S.A., has a frequency of 66 MHz, a main memory having a data transmission speed such as 66 MHz should be used so that the microprocessor can transmit the data without a waiting time. In case that the maximum RAS access time tRAC is 50 nsec, the maximum cycle frequency is 66.7 MHz in the burst EDO mode type DRAM, while the CAS access time tCAC is increased to 10 nsec. Thus, it is difficult to match the bus clock frequency of 66 MHz.

Meanwhile, the synchronous type DRAM can be used for a 66 MHz bus clock signal, but application of the synchronous type DRAM to the main memory of a personal computer is delayed due to a higher cost of the synchronous type DRAM than that of the EDO type DRAM.

In a case of the present burst EDO type DRAM, since the burst cycle time tPC is at minimum 15 nsec and CAS access time tCAC is at maximum 10 nsec in a product whose RAS access time tRAC is 50 nsec, the maximum operation frequency is 66.7 MHz.

However, it is difficult for the burst EDO mode type DRAM to operate at the maximum frequency 66.7 MHz after the system is constructed. The major problem is in the time it takes for the /CAS signal to become the "Low Active" after outputting the data. In other word, since if the data is read at the burst cycle time tPC of 15 nsec, the tCAC becomes 10 nsec. So the time it takes for the /CAS signal to become "Low Active" after outputting the data is 5 nsec, but the time the data is assuredly maintained for only 3 nsec. Accordingly, there is a problem in a timing-design because of the skew between signals and the delay in the wiring.

Under these circumstances, the maximum operation frequency of the memory device should be over 100 MHz and the tCAC should be shortened as much as possible so that the main memory of the PC is used in accordance with a high speed operation of 75–100 MHz which are regarded as the next generation bus clock frequencies.

FIG. 1 is a timing diagram illustrating the read operation of a conventional EDO type DRAM.

With reference now to FIG. 1, in a case where a /RAS signal is "Low Active", if a row address XA is inputted and a column address YA is inputted thereof, and the /CAS signal becomes the "Low Active" after a time tRCD1 (i.e., the time at which the /CAS signal becomes the active status after the /RAS signal is activated) is passed, the data DA0 from the first column address YA to the data DA3 from the third column address YA are subsequently outputted. Specially, the first data DA0 is outputted after the time tCAC from the /CAS signal which is low-activated after a time tRCD2 (tRCD2 is the time at which the /CAS signal is toggled from a first logic high level to a logic low level after both the /RAS and /CAS signals are activated). In FIG. 1, the data DA0–DA3 and DB0–DB3 for the column address are subsequently outputted and then /WE signal becomes the "Low Active", so the burst read operation is ended. The /WE and /OE signals are inputted in a non-synchronous type with no relation to the /CAS signal. In case that a sequent burst data of more than four is read, it is okay if a new column address is inputted at every fourth /CAS falling edge after the first column address is inputted.

FIG. 2 is a block diagram illustrating a column path of a conventional burst EDO type DRAM.

With reference to FIG. 2, since a two stages pipe line structure which can adjust a column address latch 10 and datainput/output buffers 12 and 14 to the /CAS signal, a higher speed operation of a column access can be performed than that of the EDO mode type. However, the burst mode type DRAM is operated by the non-synchronous type DRAM which does not use an external clock signal, and the two stages pipe line are merely applied, thereby not shortening the time tCAC any further.

As described above, there is a problem that the conventional burst EDO mode type DRAM is operated by the non-synchronous type DRAM which does not use the external clock signal, and the time tCAC is not shortened since the 2 stages pipe line structure is applied. Accordingly, there is a problem in that the conventional burst EDO mode type DRAM does not operate at a maximum frequency of 66.7 MHz after the system is constructed completely.

SUMMARY OF THE INVENTION

Therefore, it is an object of the present invention to provide a control method and an apparatus for performing high speed burst operation which can perform high speed burst read/write operations at a speed superior to an operation speed of a burst EDO mode type DRAM by shortening a CAS access time tCAC, and can produce an identical package using signals which are used in a memory device of a EDO mode type DRAM.

In order to achieve the above object, there is provided to a control method for performing high speed burst, the method comprising the steps of preparing an "Idle" status where an internal circuit is precharged after a "Power On" status, determining a read mode, a write mode, a read/write mode, or a write/read mode in accordance with a /WE signal at a falling edge of a /CAS signal in which a column address is inputted in a case of a "Row Open" status by an instruction which is inputted during said "Idle" status, and automatically returning to said "Row Open" status if an operation of said read, write, read/write, or write/read mode is ended.

In order to achieve another object, there is provided to an apparatus for performing high speed burst operation, the apparatus comprises a CAS clock generator for outputting a CAS clock with same phase in accordance with a CAS signal which is inputted therein, a column address latch circuit for being synchronized by a CAS clock and latching an output signal of a column address buffer, a burst address counter for being synchronized by the CAS clock and outputting a column address signal to the column address latch circuit, a column decoder for being synchronized by the CAS clock and selecting data for the corresponding cells by receiving the column address signal stored in the column address latch circuit, and a data-out buffer for being synchronized by the CAS clock and latching data inputted therein.

BRIEF DESCRIPTION OF THE DRAWINGS

The above object and other features of the present invention will become more apparent by describing the preferred embodiments thereof with reference to the accompanying drawings, in which:

FIG. 9B is a WCBR timing diagram illustrating a setting operation of the mode resistor depicted in FIG. 9A.

DETAILED DESCRIPTION OF THE PREFERRED EMBODIMENT

Now, the preferred embodiments of the present invention configured as above are explained in detail in connection with attached drawings.

Figure 1:
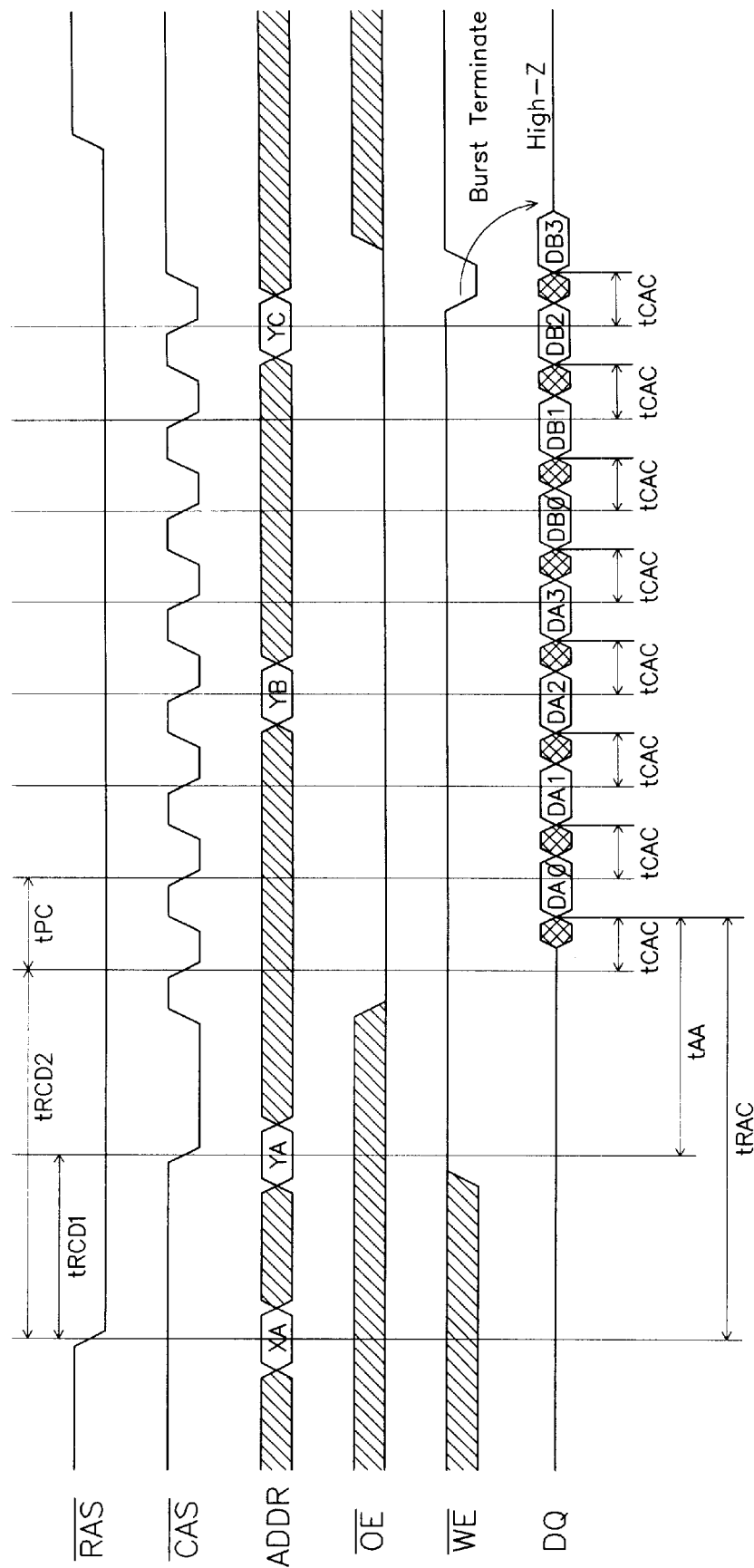
FIG. 1 is a timing diagram illustrating the read operation of a conventional burst extended data out (EDO) type dynamic random access memory(DRAM).
Figure 2:
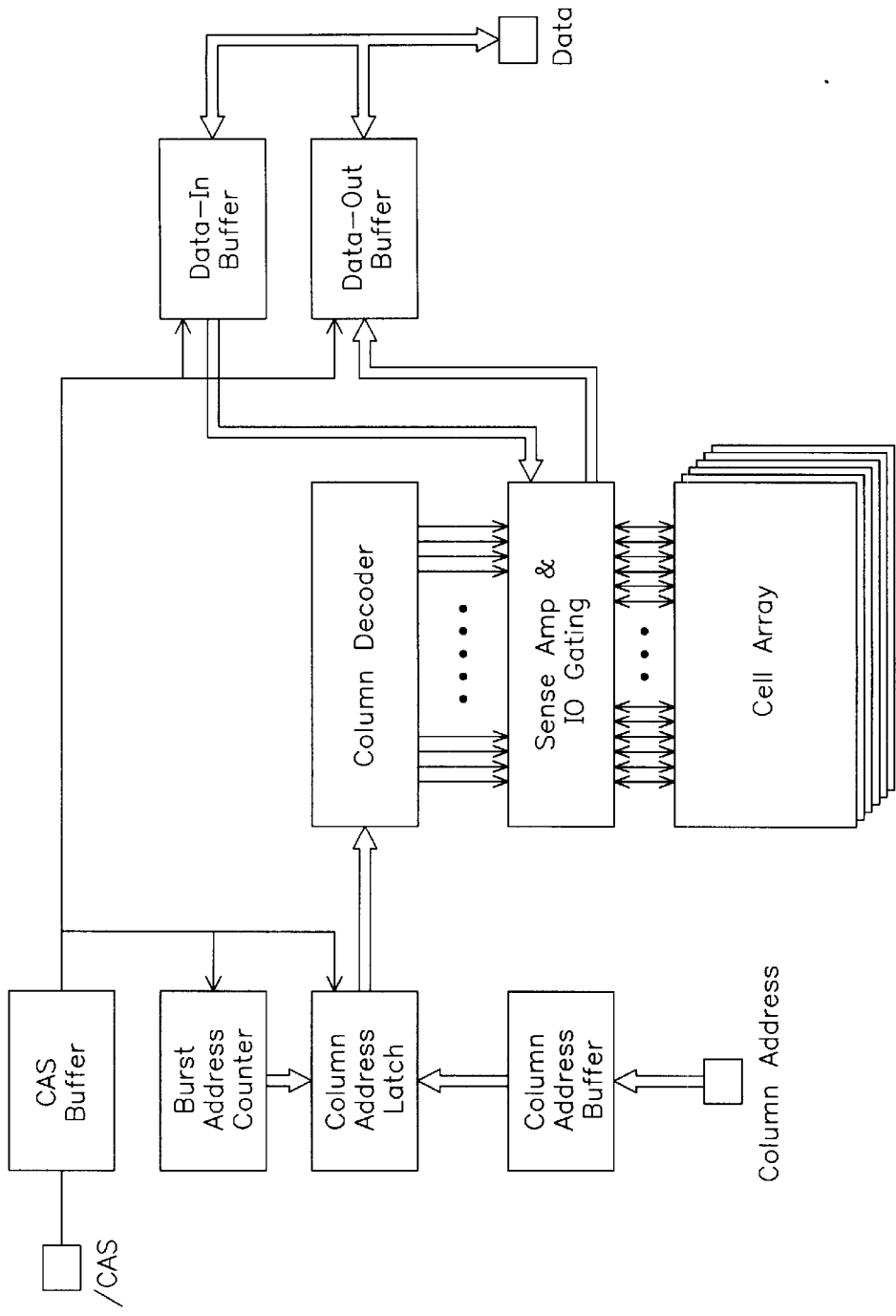
FIG. 2 is a block diagram illustrating a column path of a conventional burst EDO type DRAM.
Figure 3:
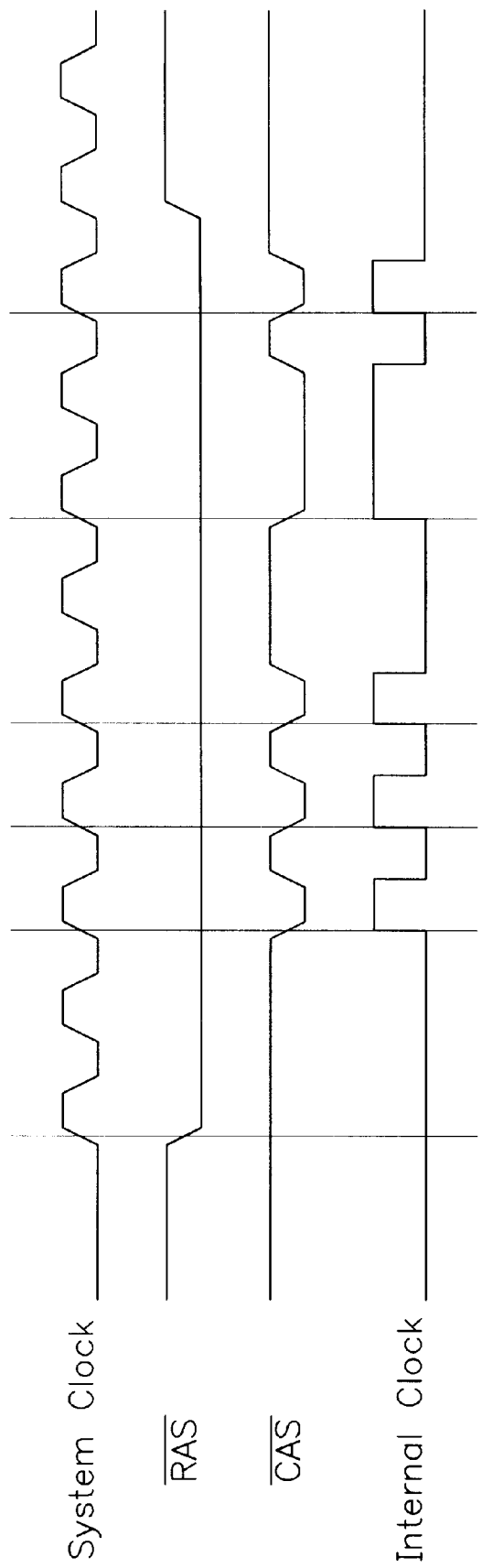
FIG. 3 is a waveform diagram illustrating an internal clock signal generated by a /CAS signal according to a preferred embodiment of the present invention.

FIG. 3 is a waveform diagram illustrating an internal clock signal generated by a /CAS signal according to a preferred embodiment of the present invention.

With reference to FIG. 3, the present invention has the feature that a /WE signal and a /OE signal are inputted in accordance with a falling edge of a /CAS signal, i.e., such signals /OE and /WE are inputted as the conditions of setup time and hold time in accordance with the falling edge of the /CAS signal.

In case that a /RAS signal becomes the "Low Active" and is used in read/write operations, an internal clock is generated in accordance with the /CAS signal which is inputted after delaying a time tRCD which is a delay time between the /RAS and the /CAS signals. Thus, if the /CAS signal is inputted by synchronizing to a system clock, the internal clock is synchronized and the /CAS signal is generated.

According to FIG. 3, a high speed access operation which is almost equal to a high speed synchronous type memory device can be performed by synchronizing a column path according to the internal clock.

Thus, a three stages pipe line structure which is applied to a high speed synchronous type memory or a prefetch structure can be applied to the high speed burst memory structure of the present invention, thereby shortening a CAS access time tCAC.

Figure 4:
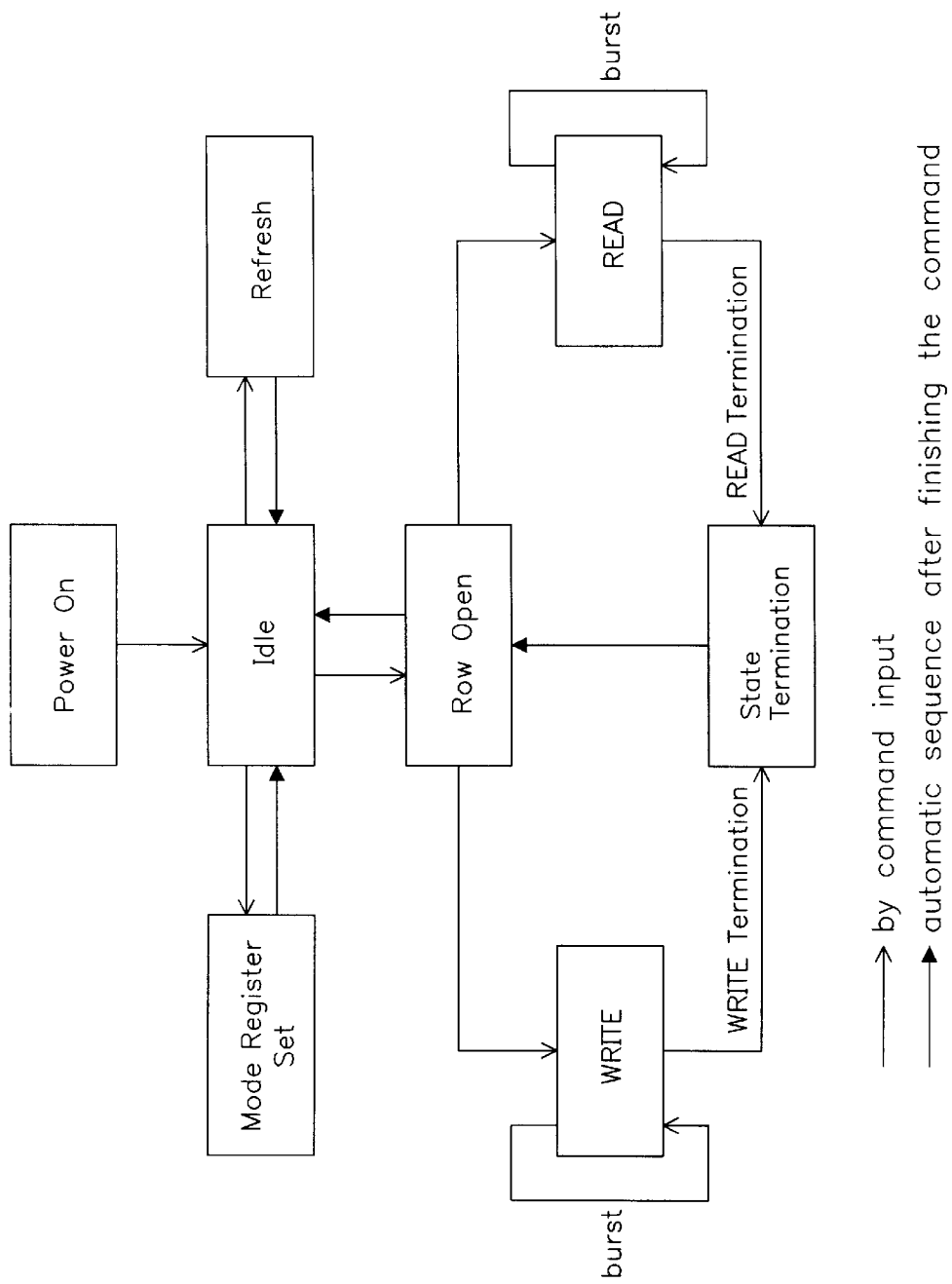
FIG. 4 is a block diagram illustrating the operation flow of a high speed burst control apparatus according to the present invention.

FIG. 4 is a block diagram illustrating the operation flow of a high speed burst control apparatus according to the present invention.

With reference now to FIG. 4, in a case of "Power On" status, an internal circuit is precharged and maintains an "Idle" status. Next, the internal circuit becomes "Mode Register Set", "Refresh" or "Row Open" status in accordance with each instruction given thereto. In the "Row Open" status, the internal circuit becomes "Read" or "Write" status according to the /WE signal at a falling edge of the /CAS signal at which the column address is inputted.

At this stage, if a burst read or a burst write operation is ended, the internal circuit automatically becomes the "Row Open" status through a "State Termination" status during one cycle of the CAS clock. In the "State Termination" status, the column path is precharged, a burst counter and a control circuit are reset, and the internal circuit becomes the "Row Open" status.

Figure 5A:
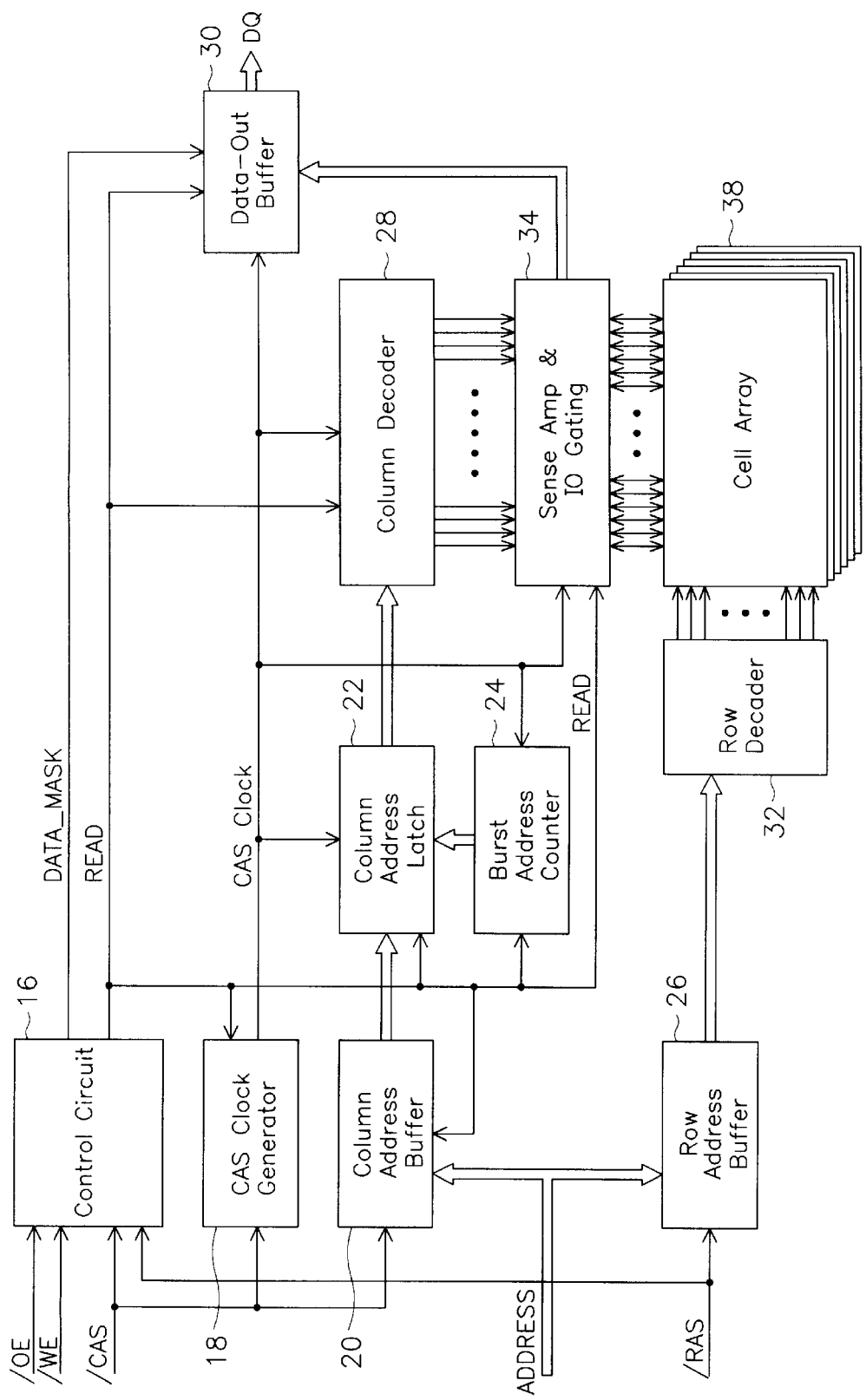
FIG. 5A is a block diagram illustrating a read operation of a high speed burst control apparatus of a preferred embodiment of the present invention.

FIG. 5A is a block diagram illustrating the read operation of a high speed burst control apparatus of a preferred embodiment of the present invention.

With reference now to FIG. 5A, a burst control apparatus of a preferred embodiment of the present invention includes a control circuit 16 for receiving a /RAS, a /CAS, a /WE, and a /OE signal and outputting a read signal and a data mask signal, a CAS clock generator 18 for receiving the /CAS and read signals and outputting a CAS clock having a same phase, a column address buffer 20 for receiving the /CAS and read signals and inputting /outputting a column address in accordance with the falling edge of the /CAS signal at a column address setup time tAS and a column address hold time tAH, a column address latch 22 for receiving the read and CAS clock signals, latching a new column address inputted to the column address buffer 20 and outputting the read and CAS clock signals to a column decoder 28, and latching the burst column address from a burst column address counter 24 during an write operation and outputting the read and CAS clock signals to the column decoder 28, a burst address counter 24 for receiving the read signal and the CAS clock, generating a sequence burst column address when the burst operation is performed, and outputting them to the column address latch 22, a row address buffer 26 for receiving a row address by receiving the /RAS signal and outputting it to a row decoder 32 so as to perform the decoding operation, a column decoder 28 for receiving the CAS clock and the read signal and decoding the column address provided from the column address latch 22, data-out buffer 30 for receiving the CAS clock, the read, and the data mask signals and subsequently outputting the data in accordance with the CAS clock, and a sense amplifier & input/output(I/O) gate circuit 34, including data buses and switching device, for sensing/amplifying cell data and providing amplified data to the data-out buffer 30.

In FIG. 5A, if the /WE signal is at the logic high level by a write enable setup time tWS and a write enable hold time tWH at the falling edge of the /CAS signal, the read signal becomes the logic high level. The read signal is created by synchronizing to the CAS clock, since the read signal checks whether the /CAS signal is the /RAS of the logic low level or the /WE of the logic high level at every falling edge of the /CAS signal. At this moment, if the /WE signal becomes the logic low level, the read signal becomes the logic low level from a falling edge of corresponding /CAS signal and thus the read operation is ended.

Data mask signal checks if the /OE signal is at the logic low level at every falling edge of the /CAS signal in the read operation, thereby masking the data which is outputted after the time tCAC from the falling edge of the CAS signal. That is to say, if the /OE signal is at the logic low level, the data is outputted, while if it is at the logic low level, the data is not outputted by masking the data.

Accordingly, the column access operation can be speedily performed since the CAS clock provided from the CAS clock generator is inputted to the column address latch circuit 22, the burst address counter 24, the column decoder 28, the sense amplifier & I/O gate circuit 34, and the data-out buffer 30, and these structures perform the pipe line operation. Namely, it is noted that a period of the burst cycle time tPC is shortened by shortening the CAS access time tCAC.

Figure 5B:
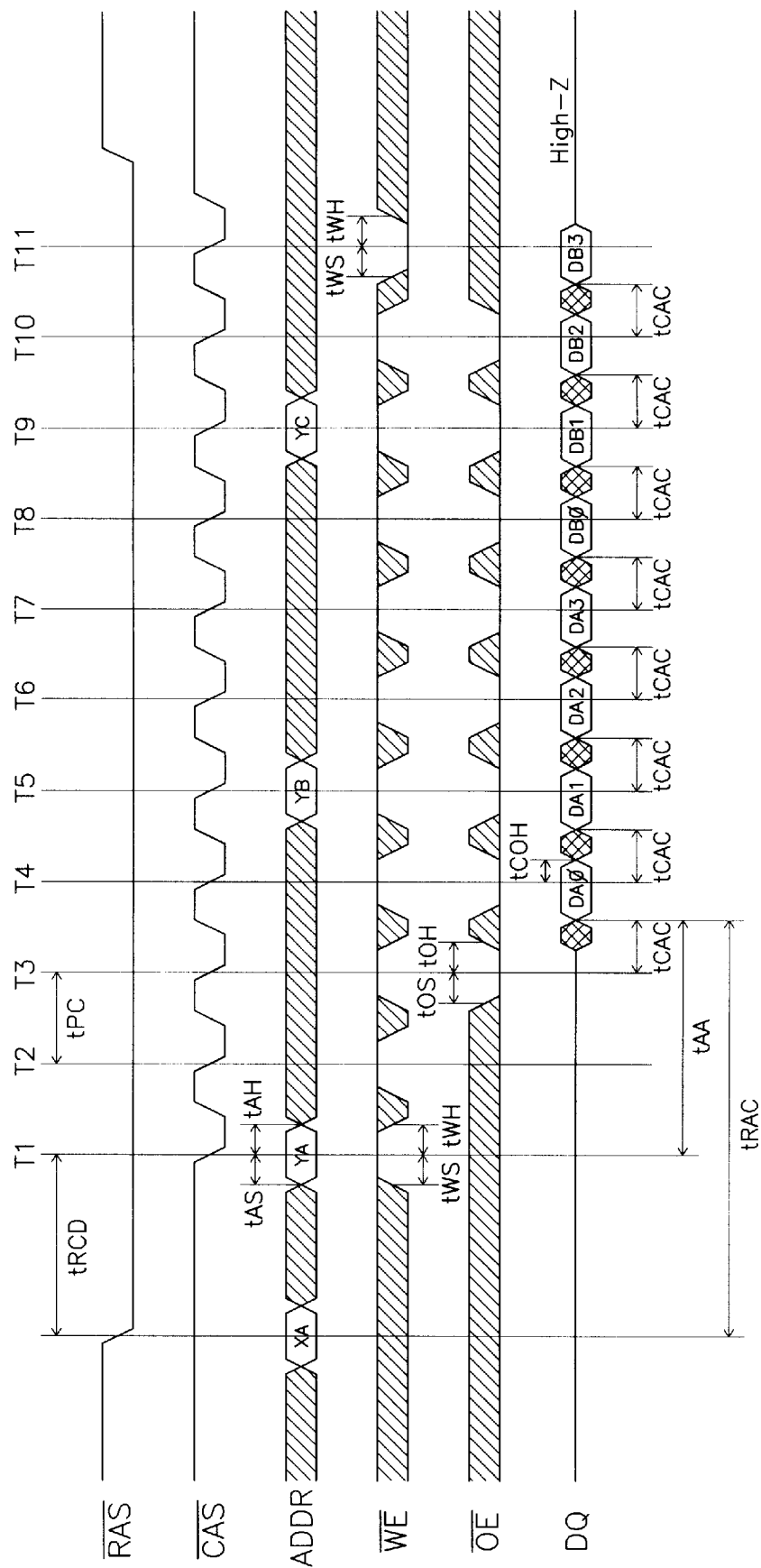
FIG. 5B is a timing diagram illustrating a first embodiment of a read cycle of the control apparatus depicted in FIG. 5A.

FIG. 5B is a timing diagram illustrating the first embodiment of a read cycle of the control apparatus depicted in FIG. 5A, wherein the CAS latency is 3 and the burst length is 4.

With reference now to FIG. 5B, when the /RAS signal becomes at the logic low level, the row address signal XA is also inputted. Next, the column address signal YA is inputted after the delay time tRCD i.e., at a time T1 at which the /CAS signal becomes at the logic low level.

Accordingly, the burst data DA0, DA1, DA2, and DA3 corresponding to the column address signal YA is subsequently outputted after the CAS access time tCAC from the falling edges T3, T4, T5, and T6, respectively, and the data is maintained during a time tCOH after the /CAS signal becomes at the "Low Active". The burst data DB0, DB1, DB2, and DB3 corresponding to the column address signal YB which is inputted to T5 is also subsequently outputted after the CAS access times tCAC from falling edges T7, T8, T9, and T10, respectively. The /WE signal is inputted in accordance with the falling edge of the /CAS signal by the setup time tWS and the hold time tWH during the time Tn in which the /CAS signal is becomes the logic high level from the logic low level. As a result of this operation, it is indicated that the present status is the "Read" or the "Write" status.

In FIG. 5B, since the /WE signal maintains at the logic high level in the period Ti, it indicates the "Read" status, the /WE signal becomes at the logic low level in the period T11, and the burst read operation is ended. Since the output data is activated in accordance with the /OE signal in the "Read" status, the /OE signal should be at the logic low level at the falling edge of the /CAS signal which acts as the reference (i.e., the falling edge of the /CAS signal which acts as the reference of the CAS access time tCAC) so as to output each burst data.

Since the /OE signal is regarded as indifferent care in the "Write" status, the write operation is performed with no relation to the /OE signal.

Figure 5C:
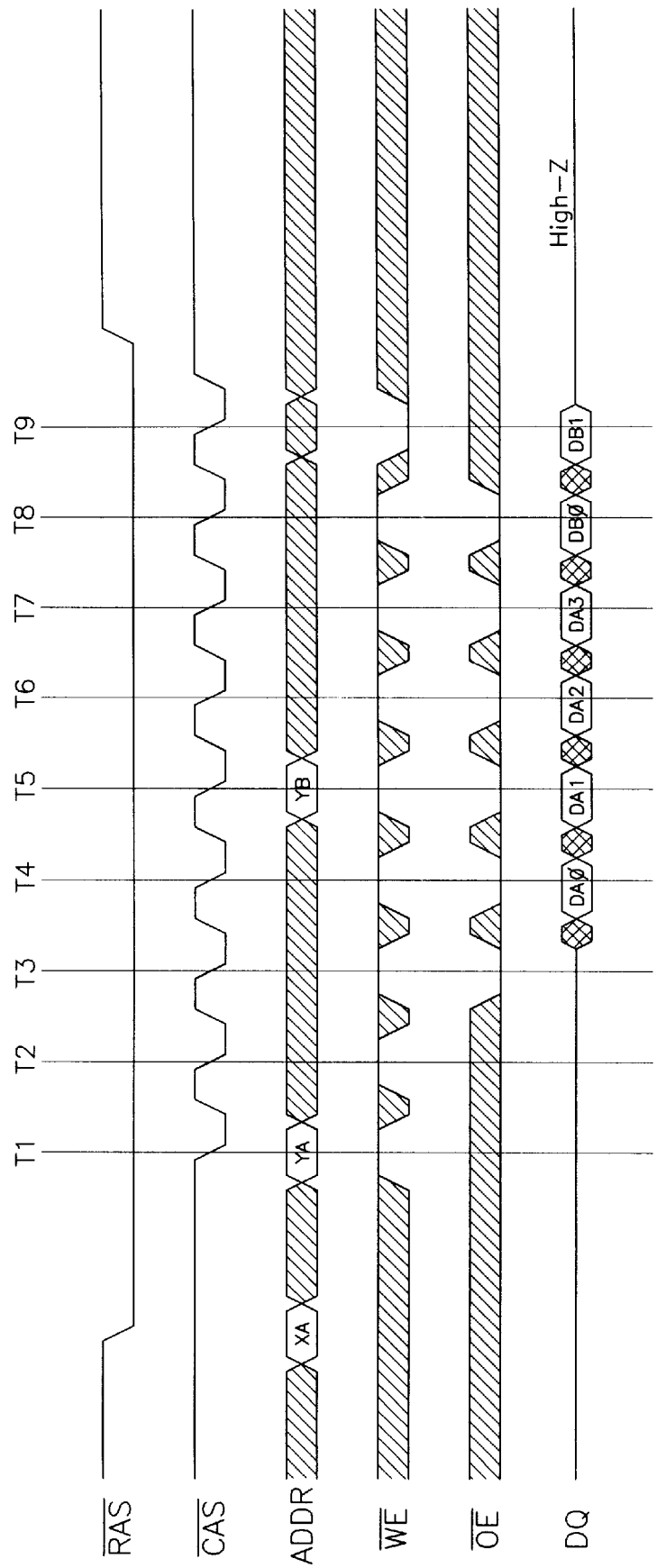
FIG. 5C is a timing diagram illustrating a second embodiment of a read cycle of the control apparatus depicted in FIG. 5A.

FIG. 5C is a timing diagram illustrating the second embodiment of a read cycle of the control apparatus depicted in FIG. 5A.

With reference now to FIG. 5C, the read cycle of the second embodiment of the present invention is performed by the same signal system as that depicted in FIG. 5B, with the main difference that the read operation is ended when the /WE signal becomes at the logic low level in the period T9.

Accordingly, it is noted that the data DB0 and DB1 are outputted among the data of the column address signal YB as shown in FIG. 5C.

In the above explanation according to FIGS. 5B and 5C, the CAS latency means that which rank meets to the /CAS signal so as to output the data after the column address is inputted in accordance with the falling edge of the /CAS signal. Also, the burst length means the number of the burst data which is subsequently outputted to the inputted column address. Hence, the column address is not accepted in the T2, T3, T4, T6, T7, and T8. Namely, a point of time at which a new column address is inputted is determined in accordance with the burst length. For instance, if the read or write operation is performed in sequence, a new column address is inputted from the T1, T3, T5, and T7 etc., when the burst length is 2.

As shown in FIG. 5A, in case that the column address YA in the burst address counter 24 is provided with the column address buffer 20 at the /CAS falling edge T1, the column addresses YA+1, YA+2, and YA+3 are generated in sequence at the T2, T3, and T4 by the burst address counter 24 and provided with the column address latch circuit after the column address YA is stored in the column address latch circuit 22.

Figure 6A:
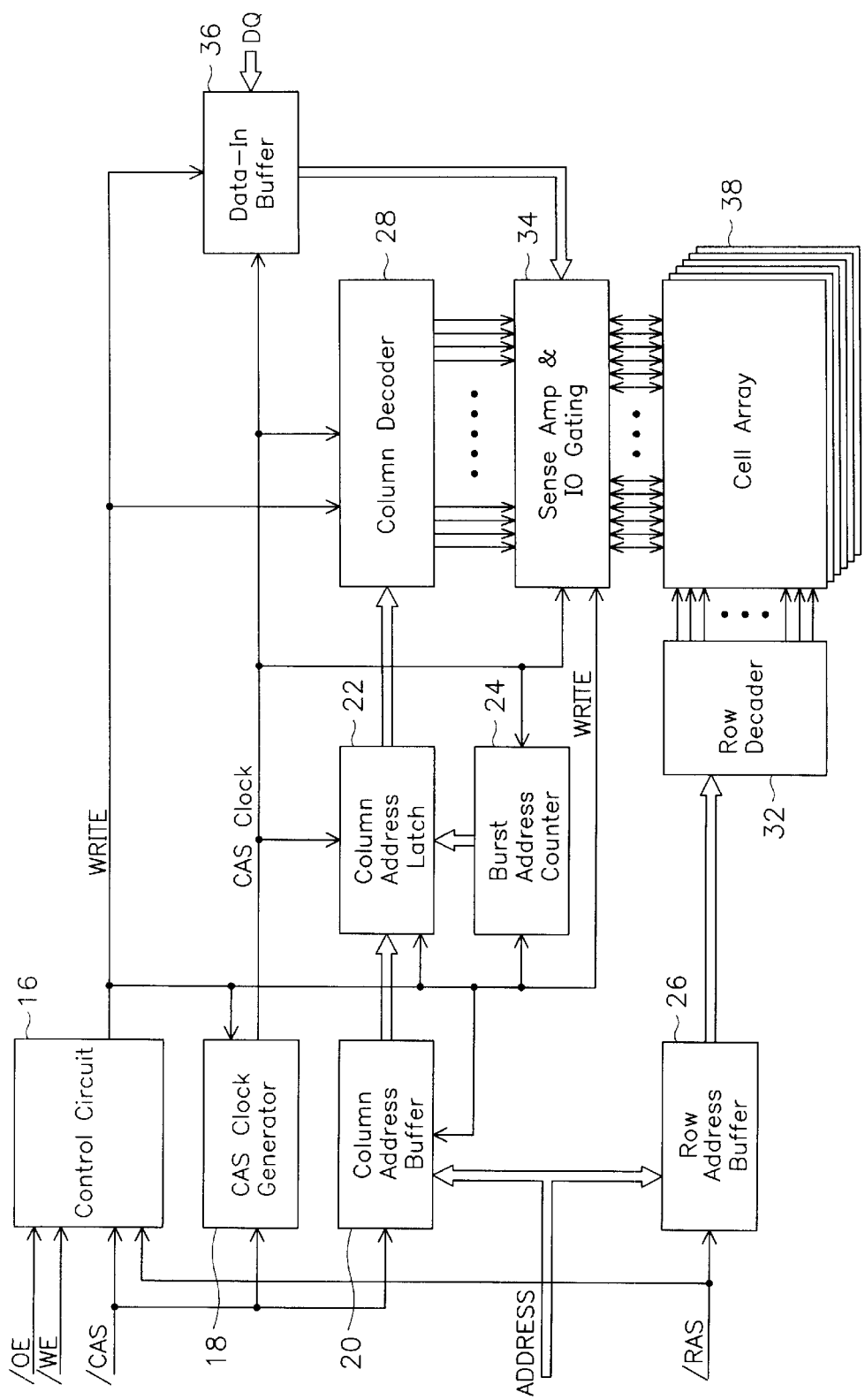
FIG. 6A is a block diagram illustrating a write operation of a high speed burst control apparatus of a preferred embodiment of the present invention.

FIG. 6A is a block diagram illustrating the write operation of a high speed burst control apparatus of the preferred embodiment of the present invention. The same numeral references in FIG. 5A are also given in FIG. 6A, if they refer to the same structure or operation. Also, a repeated explain will be omitted hereinafter.

With reference now to FIG. 6A, the major differences from FIG. 5A are as follows. First, the output signal of the control circuit 16 is a write signal instead of the read signal. Second, a data-input buffer 36 is equipped on the control apparatus instead of the data-out buffer 30. Third, the data is inputted through data input/output lines, and the data stored in the data-input buffer 36 is inputted to the sense amplifier & I/O gate circuit 34 and then stored in memory sell array 38.

Namely, the control circuit 16 receives the /RAS, /CAS, /WE, and /OE signals and generates the write signal thereof. (The /OE signal is regarded as indifferent in the write mode.)

After the /RAS signal becomes at the logic low level, the write signal which is at the logic low level at the falling edge of the /CAS signal by the setup time tWS and the hold time tWH becomes at the logic high level. The write signal is synchronized with the CAS clock and is generated, and the write signal checks that the /RAS is at the logic low level or the /WE is at the logic low level at every falling edge of the CAS signal. At this moment, if the /WE signal becomes at the logic high level, the write signal becomes at the logic low level from the falling edge of the /CAS signal, and thus the write operation is ended.

The column address latch circuit 22 receives the write signal and the CAS clock and latches a new column address inputted to the column address buffer 20. Also, if the burst write or the burst read operation is performed, the burst column address is latched from the burst address counter 24.

The burst address counter 24 receives the write signal and CAS clock and generates the burst column address in sequence when the burst operation is performed.

The data-out buffer 36 receives the CAS clock and the write signal and subsequently receives the write data in accordance with the CAS clock.

Figure 6B:
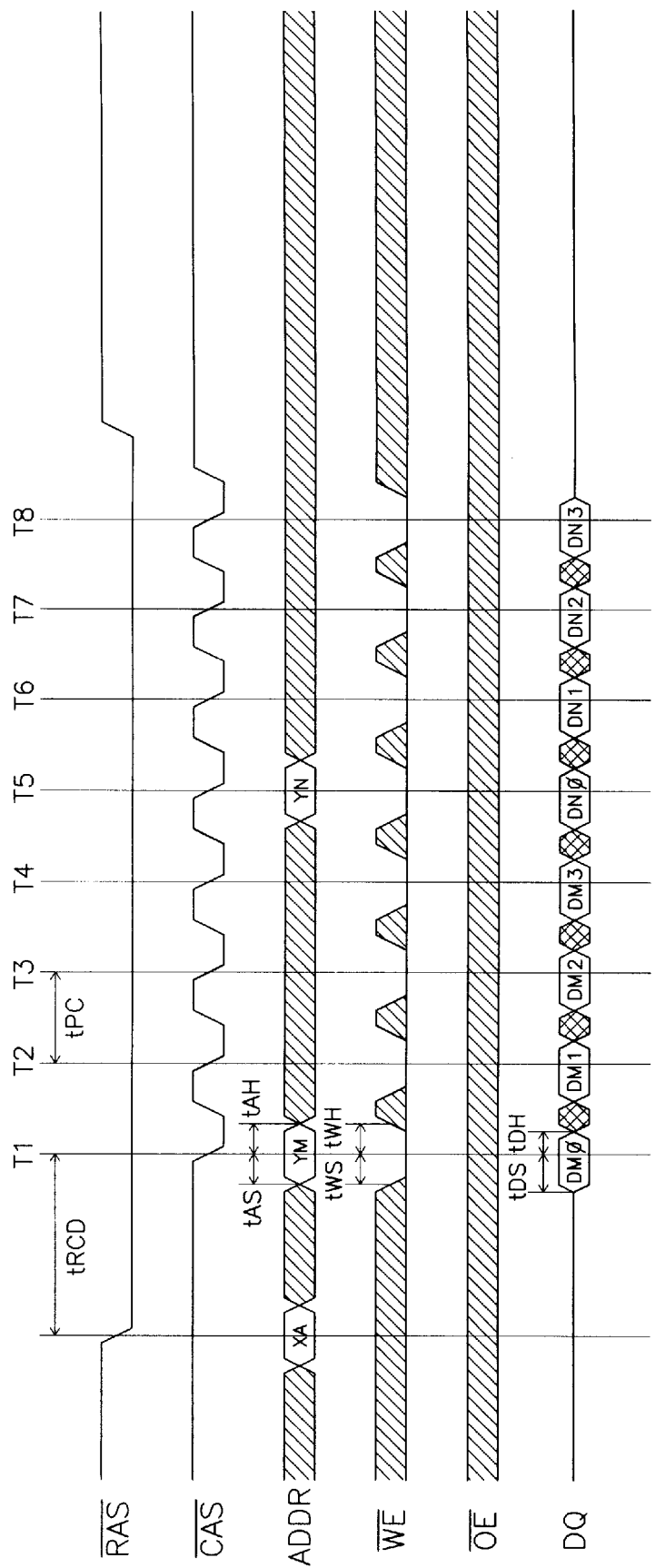
FIG. 6B is a timing diagram illustrating a first embodiment of a write cycle of the control apparatus depicted in FIG. 6A.

FIG. 6B is a timing diagram illustrating the first embodiment of a write cycle of the control apparatus depicted in FIG. 6A.

With reference to FIG. 6B, the low address XA is inputted where the /RAS signal becomes at the logic low level, and then the column address YM is inputted at the time T1 at which the /CAS signal becomes at the logic low level after the delay time tRCD. The /WE signal is at the logic low level at the falling edge T1 and indicates the "Write" status, and four data DM0, DM1, DM2, and DM3 which will be written in column addresses YM, YM+1, YM+2, and YM+3, respectively are inputted in sequence. At this moment, each data is inputted under the condition of the data input setup time tDS and the data input holding time tDH based on the falling edge of the /CAS signal.

In writing timing diagram of FIG. 6B, the burst length is 4 and the CAS latency is always 0 in write mode as depicted in FIG. 5B. The data DM0, DM1, DM2, and DM3 for the column addresses YM, YM+1, YM+2, and YM+3 which are inputted to the falling edge T5 are written and become the "Idle" status, since the /RAS signal becomes at the logic high level.

Figure 6C:
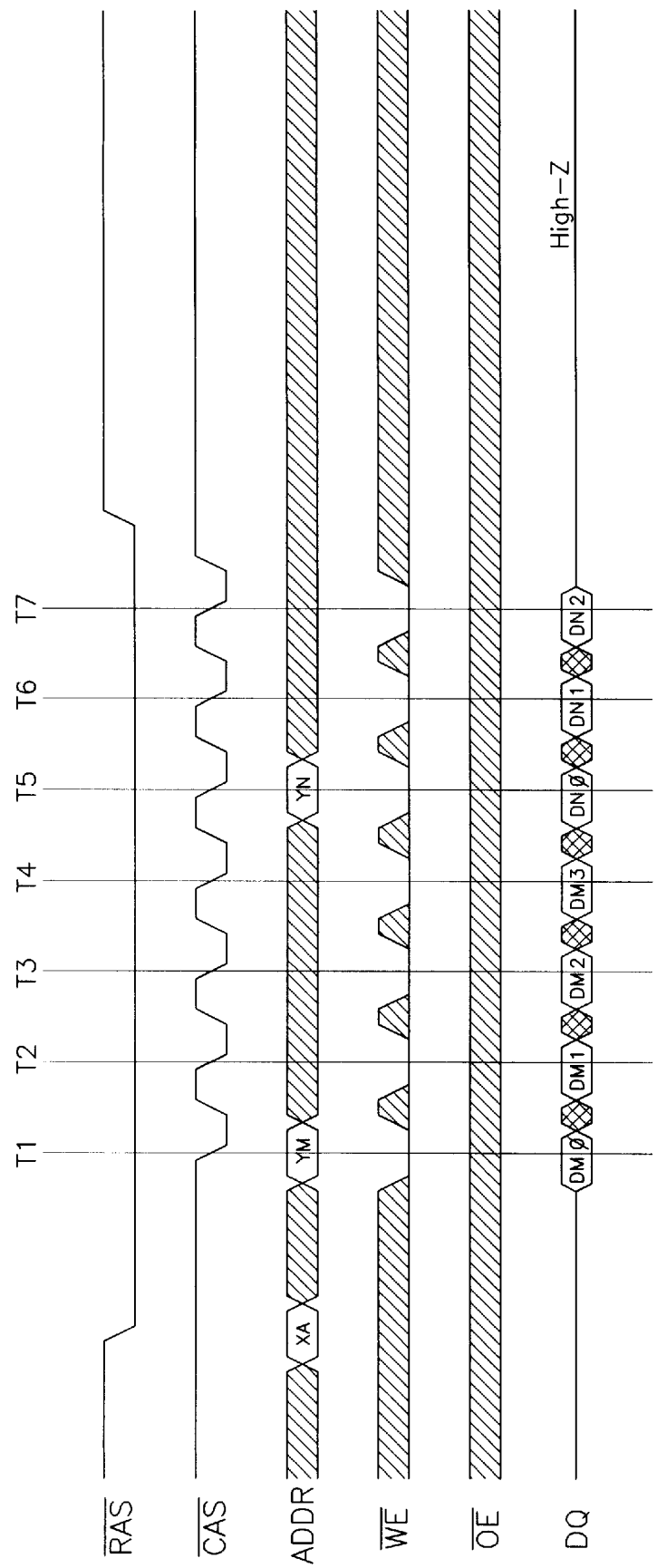
FIG. 6C is a timing diagram illustrating a second embodiment of a write cycle of the control apparatus depicted in FIG. 6A.

FIG. 6C is a timing diagram illustrating a second embodiment of a write cycle of the control apparatus depicted in FIG. 6A.

In FIG. 6C, it is noted that the write operation is ended since the /RAS signal becomes at the logic high level after the T7. Accordingly, three data DN0, DN1, and DN2 are written in column addresses YN, YN+1, and YN+2, respectively.

Figure 7A:
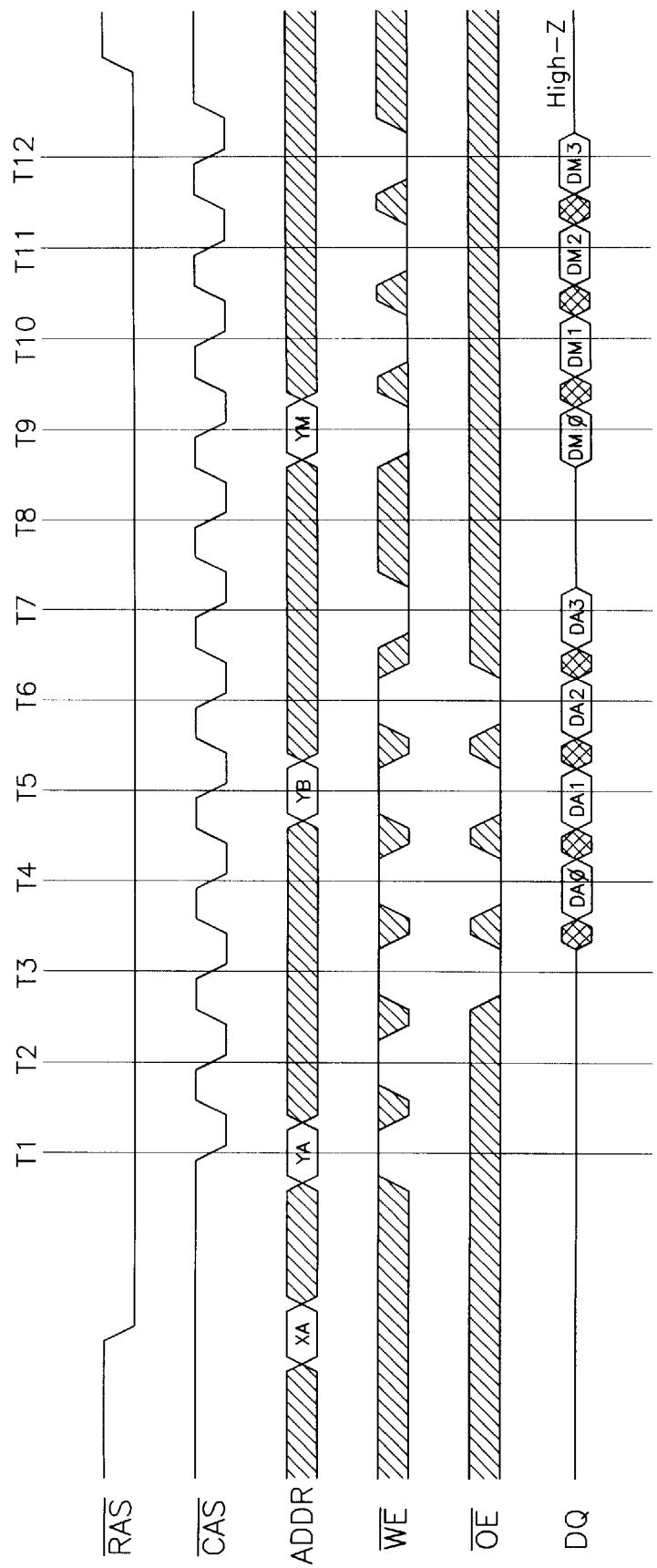
FIG. 7A is a timing diagram illustrating a first embodiment of a read/write cycles of the control apparatus of the present invention.

FIG. 7A is a timing diagram illustrating the first embodiment of a read/write cycles of the control apparatus of the present invention.

With reference now to FIG. 7A, the low address XA is inputted where the /RAS signal becomes at the logic low level, and next the column address YA is inputted at the time T1 on which the /CAS signal becomes at the logic low level after the delay time tRCD. The /WE signal is at the logic high level in the falling edge T1, it indicate the "Read" status, and four data DA0, DA1, DA2, and DA3 which will be read in column addresses YA, YA+1, YA+2, and YA+3, respectively are inputted in sequence.

In read /write timing diagram depicted in FIG. 7A, the CAS latency in the read operation is 3, and the burst length is 4. The /WE signal is at the logic low level on the time T7, and "State termination" is automatically changed to the "Row Open" status on the time T8. Accordingly, the data for the column address YB is not outputted. The "Read or Write" status is determined in accordance with the /WE signal in the time T9. At this moment, since the /WE signal is at the logic low level, it becomes "Write" status. Thus, the data is written to the column address YM, YM+1, YM+2, and YM+3.

Figure 7B:
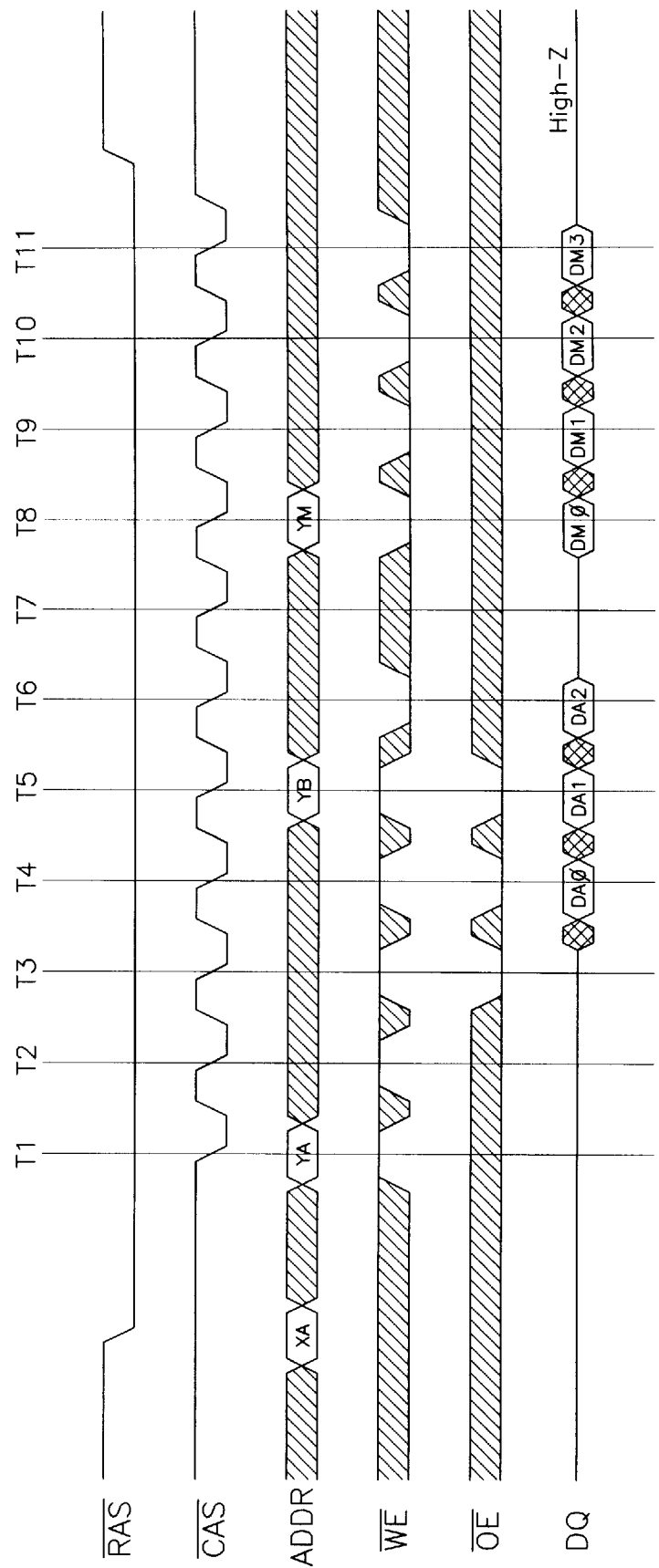
FIG. 7B is a timing diagram illustrating a second embodiment of a read/write cycle of the control apparatus of the present invention.

FIG. 7B is a timing diagram illustrating a second embodiment of a read/write cycle of the control apparatus of the present invention.

In FIG. 7B, the /WE signal become the logic low level, unlike in FIG. 7A, the "State Termination" status is performed in the T7 thereof and the "Write" operation is performed in the T8. In this case, even if a level of the /RAS signal is changed from the logic low level to the logic high level, the "Idle" status is performed.

Figure 8A:
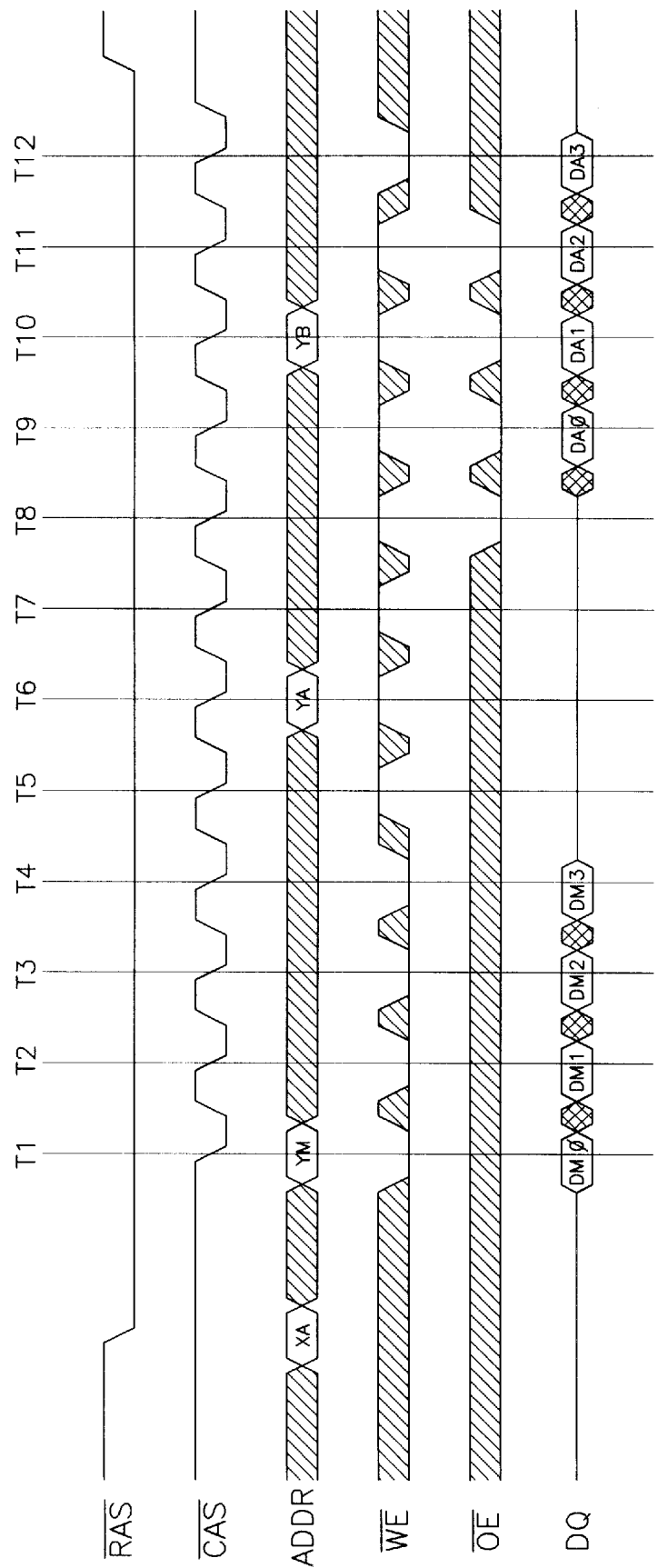
FIG. 8A is a timing diagram illustrating a first embodiment of a write/read cycle of the control apparatus of the present invention.

FIG. 8A is a timing diagram illustrating a first embodiment of a write/read cycle of the control apparatus of the present invention.

With reference now to FIG. 8A, the low address XA is inputted where the /RAS signal becomes at the logic low level, and next the column address YM is inputted at the time Ti on which the /CAS signal becomes at the logic low level after the delay time tRCD. The /WE signal is at the logic low level in the falling edge T1, it indicate the "Write" status, and four data DM0, DM1, DM2, and DM3 are inputted in sequence to the column addresses YM, YM+1, YM+2, and YM+3 to thereby perform the "Write" operation.

In write/read timing diagram depicted in FIG. 8A, the CAS latency in the read operation is 3, and the burst length is 4. The "State termination" status is performed since the /WE signal is at the logic high level on the T5, thus the status is automatically changed to the "Row Open" status.

The "Read or Write" status is determined in accordance with the /WE signal in the time T6. At this moment, since the /WE signal is at the logic high level, "Read" status is performed. Thus, the data to the column address YA is read. In the time T12, the /WE signal becomes the logic low level to thereby end the "Read" operation.

Figure 8B:
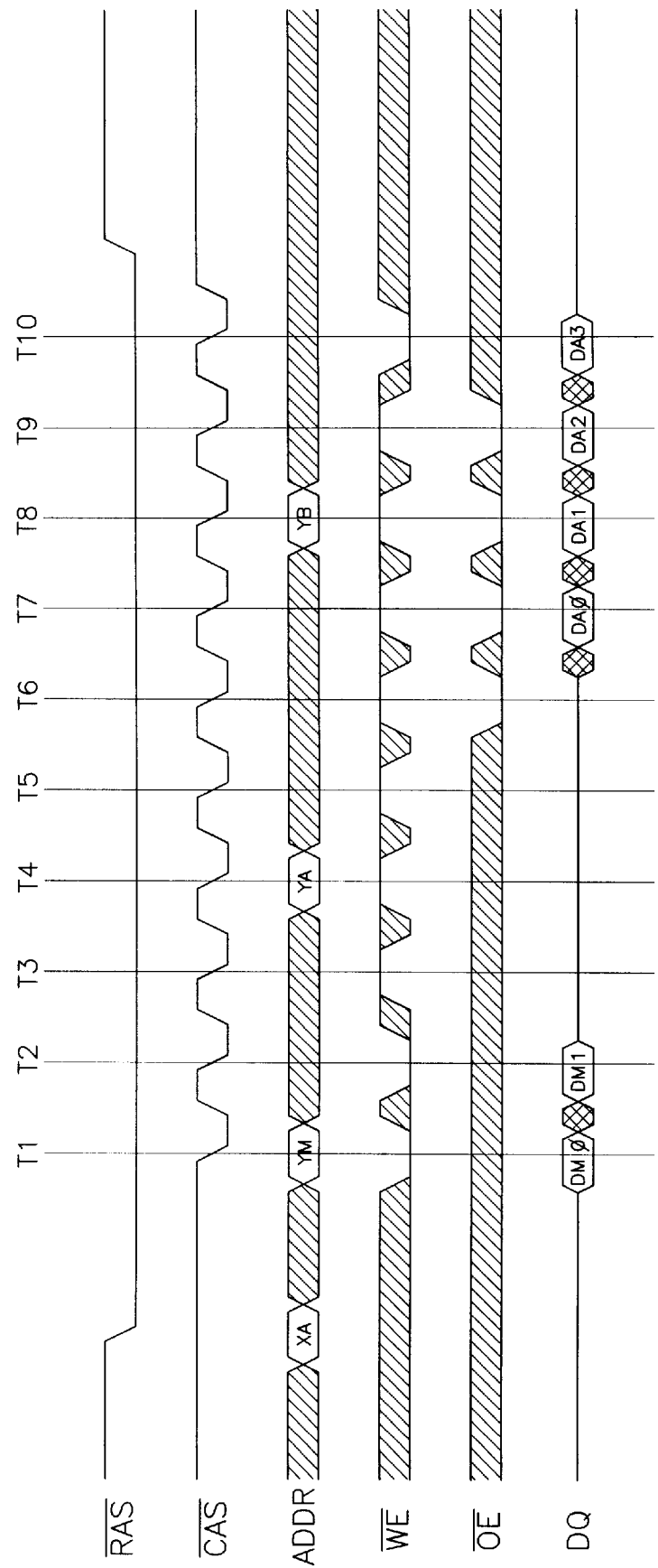
FIG. 8B is a timing diagram illustrating a second embodiment of a write/read cycle of the control apparatus of the present invention.

FIG. 8B is a timing diagram illustrating a second embodiment of a write/read cycle of the control apparatus of the present invention.

In FIG. 8B, the /WE signal become the logic high level, unlike in FIG. 7A, the "State Termination" status is performed in the T3 thereof, so the "Read" operation is performed at the T5. In the "Read" status, four data DA0, DA1, DA2, and DA3 to the column addresses YA, YA+1, YA+2, and YA+3 are outputted in sequence, and the "Read" operation is ended because the /WE signal becomes the logic low level at the T10.

Figure 9A:
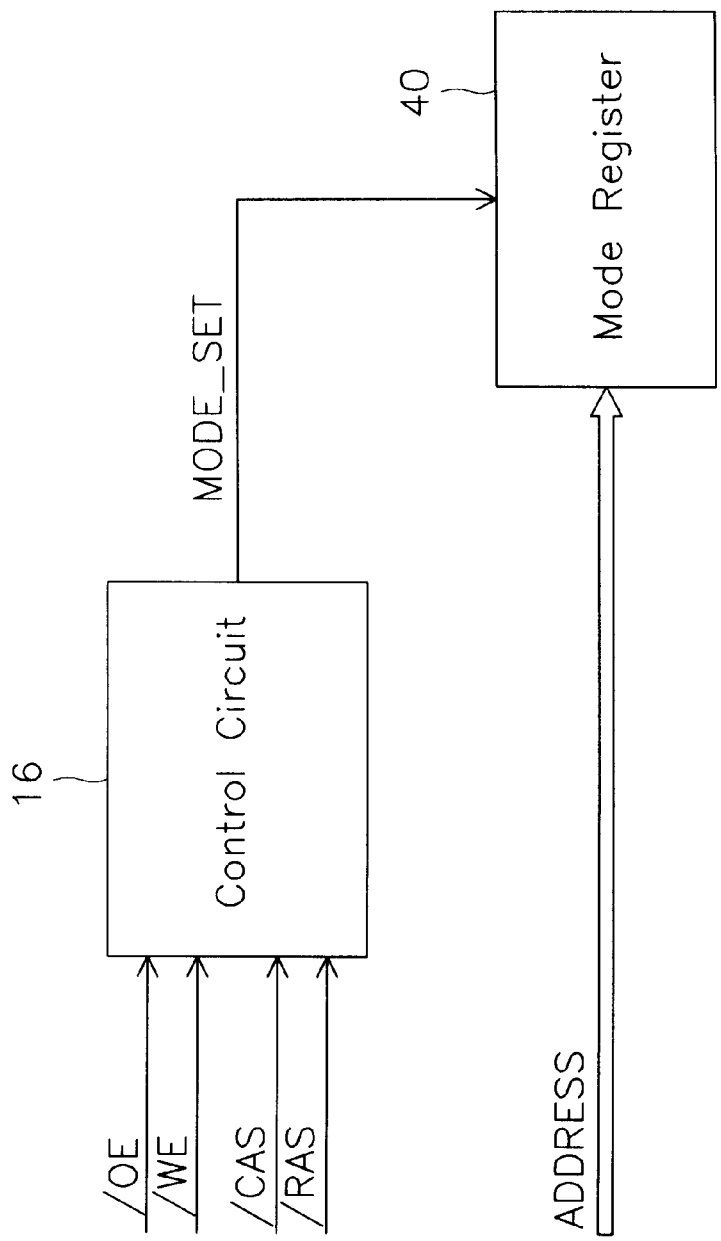
FIG. 9A is a block diagram illustrating a setting operation of a mode resistor utilized in the present invention.

FIG. 9A is a block diagram illustrating a setting operation of a mode resistor utilized in the present invention.

In FIG. 9A, the control circuit 16 receives the /OE, /WE, /CAS, /RAS signals and outputs a Mode Set signal thereof, and address signals are partially inputted to a mode resistor 40 where the address signals are set by the Mode Set signal of the logic high level.

Next, the Mode Set signal becomes the logic high level at a WCBR cycle, and the mode resistor 40 is set thereof. At this moment, the partial addresses is inputted to the mode resistor 40, and is set thereof.

FIG. 9B is a WCBR timing diagram illustrating a setting operation of the mode resistor depicted in FIG. 9A.

Figure 10:
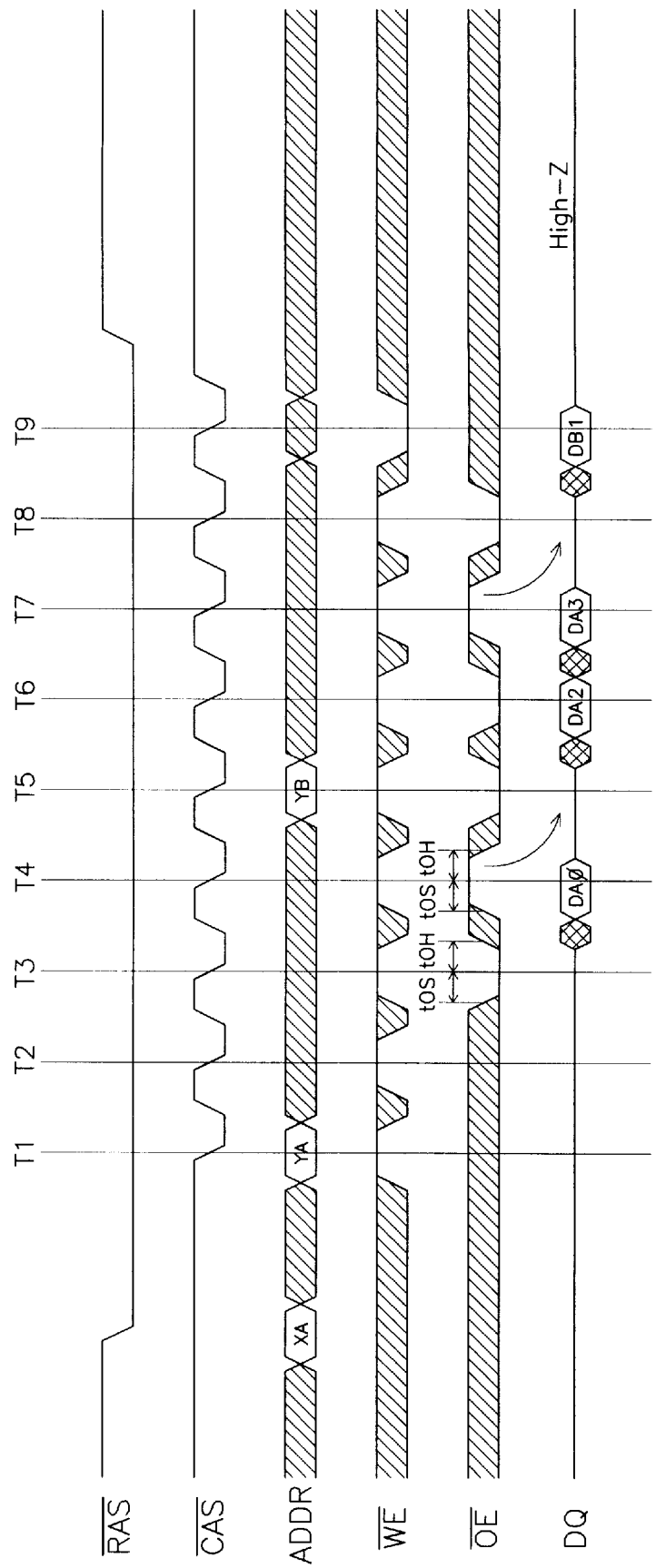
FIG. 10 is a timing diagram illustrating masking of output data by an output enable signal (i.e.,/OE signal) during read cycle according to the present invention.

In FIG. 9B, the "WCBR" means that the /CAS signal reaches the "Low Active" faster than the /RAS signal where the /WE signal is at the "Low Active". As shown in FIG. 9B, the address, which is inputted to partial address pins at the cycle WCBR, sets the mode resistor 40, instead of using as an address signal. In all mode resistor of the present invention, 1, 2, 4, and 3 are set to the burst length, Interleaved, and Sequential are set to the burst type, and 1, 2, 3, and 4 are set to the CAS latency. FIG. 10 is a timing diagram illustrating masking of output data by an output enable signal (i.e., /OF signal) during read cycle according to the present invention.

With reference to FIG. 10, the data is outputted under condition that the /OE signal should be maintained at the logic low level at the /OE signal setup time tOS and the /OE signal hold time tOH on the falling edge of the /CAS signal, which is a reference of the output data in the read operation. Accordingly, if the /OE signal is at the logic high level, the output data becomes masking status and thus the data input/output terminal DQ becomes a high impedance status. The data DA1 and DB0 are not outputted since the /OE signal is the logic high level.

As described above, provided to a method and an apparatus for performing high speed burst control which can be used for a 66 MHz bus clock frequency which can not be applied to the conventional burst EDO mode type DRAM, and for the next generation 75–100 MHz bus clocks frequency. Further, there is an advantage that the present invention does not use the external clock, unlike a synchronous type DRAM, thereby reducing the power consumption of the total memory system.

Many modifications and variations of the present invention are possible in light of the above teachings. Therefore, it is to be understood that within the scope of the appended claims, the invention may be practiced otherwise than as specifically described.

What is claimed is:

1. An apparatus for performing high speed burst operation in memory device, the apparatus comprising:

a CAS clock generator for outputting a CAS clock with same phase in accordance with a CAS signal which is inputted therein;

a column address latch circuit for being synchronized by a CAS clock and latching an output signal of a column address buffer;

a burst address counter for being synchronized by the CAS clock and outputting a column address signal to the column address latch circuit;

a column decoder for being synchronized by the CAS clock and selecting data for the corresponding cells by receiving the column address signal stored in the column address latch circuit; and a data-out buffer for being synchronized by the CAS clock wherein control signals /WE and /OE of the memory device are clock pulse type signals in an active mode and are controlled by the CAS clock.

2. The apparatus as set forth in claim 1, further comprising a sense amplifier & input/output gate circuit which is synchronized by the CAS clock to inputs/outputs the data to/from cell array.

3. A control method for performing high speed burst operation in a memory device, the method comprising the steps of:

a) receiving a /CAS signal;

b) generating an internal clock signal in response to the /CAS signal;

c) synchronizing a column path operation of the memory device with the internal clock signal;

d) generating a control signal /WE with a first clock pulse type signal in an active mode including a write operation mode and a read operation mode; and e) generating a control signal /OE with a second clock pulse type signal in the read operation mode;

wherein the first and second clock pulse type signals are controlled and activated by the internal clock signal.

* * * * *